(12) United States Patent
Cheng et al.

(10) Patent No.: US 12,256,651 B2
(45) Date of Patent: Mar. 18, 2025

(54) WITH LOW DENSITY CHANGE, PHASE-CHANGE MEMORY AND PREPARATION METHOD THEREFOR

(71) Applicant: HUAZHONG UNIVERSITY OF SCIENCE AND TECHNOLOGY, Hubei (CN)

(72) Inventors: Xiaomin Cheng, Hubei (CN); Jinlong Feng, Hubei (CN); Ming Xu, Hubei (CN); Meng Xu, Hubei (CN); Xiangshui Miao, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 489 days.

(21) Appl. No.: 17/762,742

(22) PCT Filed: Oct. 21, 2020

(86) PCT No.: PCT/CN2020/122554
§ 371 (c)(1),
(2) Date: Mar. 23, 2022

(87) PCT Pub. No.: WO2021/083010
PCT Pub. Date: May 6, 2021

(65) Prior Publication Data
US 2022/0344584 A1   Oct. 27, 2022

(30) Foreign Application Priority Data
Oct. 28, 2019   (CN) .......................... 201911033437.4

(51) Int. Cl.
*H10N 70/20*   (2023.01)
*H10B 63/10*   (2023.01)
*H10N 70/00*   (2023.01)

(52) U.S. Cl.
CPC .......... *H10N 70/231* (2023.02); *H10B 63/10* (2023.02); *H10N 70/023* (2023.02);
(Continued)

(58) Field of Classification Search
CPC .. H10N 70/231; H10N 70/023; H10N 70/841; H10N 70/8613; H10N 70/8828;
(Continued)

(56) References Cited

U.S. PATENT DOCUMENTS

| | | | | |
|---|---|---|---|---|
| 2010/0072453 A1* | 3/2010 | Jeong | ................. | H10N 70/8828 257/E45.002 |
| 2015/0048291 A1* | 2/2015 | Cheng | ................. | H10N 70/021 257/2 |
| 2018/0182958 A1* | 6/2018 | Gealy | ................. | H10N 70/841 |

FOREIGN PATENT DOCUMENTS

| | | |
|---|---|---|
| CN | 101101965 | 1/2008 |
| CN | 102832340 | 12/2012 |

(Continued)

OTHER PUBLICATIONS

"International Search Report (Form PCT/ISA/210) of PCT/CN2020/122554", mailed on Jan. 20, 2021, with English translation thereof, pp. 1-4.

(Continued)

*Primary Examiner* — Sitaramarao S Yechuri
(74) *Attorney, Agent, or Firm* — JCIPRNET

(57) ABSTRACT

A superlattice phase-change thin film with a low density change, a phase-change memory and a preparation method. The superlattice phase-change thin film includes first phase-change layers (7) and second phase-change layers (8) that (Continued)

are alternately stacked to form a periodic structure; during crystallization, the first phase-change layer (7) has a conventional positive density change, and the second phase-change layer (8) has an abnormal negative density change, therefore, the abnormal density reduction and volume increase of the second phase-change layer (8) during crystallization can be used to offset the volume reduction of the first phase-change layer (7) during crystallization.

10 Claims, 3 Drawing Sheets

(52) U.S. Cl.
CPC ....... *H10N 70/841* (2023.02); *H10N 70/8613* (2023.02); *H10N 70/8828* (2023.02)

(58) Field of Classification Search
CPC ... H10N 70/826; H10N 70/8413; H10B 63/10
See application file for complete search history.

(56) References Cited

FOREIGN PATENT DOCUMENTS

| CN | 108346739 | | 7/2018 | |
| CN | 109935688 | | 6/2019 | |
| CN | 109935688 A | * | 6/2019 | |
| CN | 110931635 | | 3/2020 | |
| EP | 1796088 A1 | * | 6/2007 | ......... G11B 7/24067 |
| JP | 2015201519 | | 11/2015 | |

OTHER PUBLICATIONS

"Written Opinion of the International Searching Authority (Form PCT/ISA/237) of PCT/CN2020/122554", mailed on Jan. 20, 2021, pp. 1-5.
Walter K. Njoroge et al., "Density changes upon crystallization of Ge2Sb2.04Te4.74 films," Journal of Vacuum Science & Technology A Vacuum Surfaces and Films, Feb. 2002, pp. 1-5.
R. E. Simpson et al., "Interfacial phase-change memory," nature nanotechnology, Aug. 2011, pp. 501-505.

* cited by examiner

WITH LOW DENSITY CHANGE, PHASE-CHANGE MEMORY AND PREPARATION METHOD THEREFOR

CROSS-REFERENCE TO RELATED APPLICATION

This application is a 371 of international application of PCT application serial no. PCT/CN2020/122554, filed on Oct. 21, 2020, which claims the priority benefit of China application no. 201911033437.4, filed on Oct. 28, 2019. The entirety of each of the above mentioned patent applications is hereby incorporated by reference herein and made a part of this specification.

TECHNICAL FIELD

The disclosure belongs to the technical field of microelectronic devices and memories, and in particular, relates to a superlattice phase-change thin film with a low density change, a phase-change memory, and a preparation method therefore.

DESCRIPTION OF RELATED ART

Phase-change memory materials have attracted much attention because they can quickly achieve reversible transformation between the crystalline state (low-resistance state) and the amorphous state (high-resistance state) by applying electrical or optical pulses. The process of changing from a high-resistance state to a low-resistance state is called the SET process, and the reverse process thereof is called the RESET process. Storage technology based on phase-change materials is considered to be one of the highly-competitive storage technologies of the next-generation.

The two states of a phase-change material have different mass densities. Generally, its crystalline state has a higher density and a smaller volume due to the ordered arrangement of atoms, and its amorphous state has a lower density and a larger volume due to the disordered accumulation of atoms. In the process of crystallization (amorphous to crystalline), a phase-change material whose density changes from low (amorphous) to high (crystalline) is called a material with a positive density change, and this kind of phase-change material with a positive density change is the most common among all phase-change materials. The volume of a phase-change material with a specific mass increases and decreases repeatedly during the erasing and writing process of the two-state transition. After a specific number of times of erasing and writing, around the effective phase-change area in the phase-change memory, spatial "voids" are generated (Njoroge W K, Wöltgens H W, Wuttig M. Density changes upon crystallization of $Ge_2Sb_{2.04}Te_{4.74}$ films[J]. Journal of Vacuum Science & Technology A: Vacuum, Surfaces, and Films, 2002, 20(1):230-233.). These "voids" cause the phase-change material to no longer contact the surrounding materials, so the conductive path is disconnected, and the device thereby fails. If the density change ratio between the two states of the phase-change material may be reduced, the generation of "voids" may be prevented, and the cyclic erasing and writing times of the device may accordingly be increased.

On the other hand, the currently used phase-change memory materials are mainly GeTe, $Sb_2Te_3$, and a homogeneous compound alloy material $Ge_xSb_{2y}Te_{x+3y}$ (x and y are both integers) composed of the two in a specific ratio. However, a series of studies have shown that interface phase-change memories (iPCM) using superlattice phase-change materials as functional materials considerably exceed phase-change memories using conventional functional materials in terms of SET speed, RESET power consumption, and cyclic erasing and writing stability (Simpson R E, Fons P, Kolobov A V, et al. Interfacial phase-change memory[J]. Nature nanotechnology, 2011, 6(8): 501.). A superlattice phase-change material is a phase-change material of two different components, is a multilayer film that alternately grows thin layers of a few nanometers to a dozen nanometers and maintains strict periodicity, and is actually a specific form of layered fine composite phase-change material. Since the superlattice phase-change memory material is an artificial composite material formed by alternately stacking two phase-change materials, it may be easily edited and controlled in terms of its characteristics compared with ordinary phase-change materials. At present, the two phase-change layer materials in the superlattice phase-change material also have the characteristics of large changes in density of the two states, resulting in "voids" during repeated erasing and writing. Therefore, the superlattice phase-change material still has the problem of device failure after repeated erasing and writing cycles.

The number of times of cyclic erasing and writing of a phase-change memory device is an important indicator of its electrical characteristics. A superlattice phase-change memory with high cyclic erasing and writing times and with a low density change is suitable for application scenarios that require frequent data exchange, so it is expected to replace DRAM in computers and thereby profoundly change the current architecture of computers.

SUMMARY

Regarding the abovementioned defects or requirements for improvement, the disclosure provides a superlattice phase-change thin film with a low density change, a phase-change memory, and a preparation method therefore with an aim to provide a superlattice phase-change thin film formed by alternate stacking of two kinds of phase-change component material layers with positive and negative density changes and exhibiting a low density or even zero density change during phase changing, so as to solve the problem of "voids" which is generated during repeated erasing and writing in the structure of a phase-change memory and to solve the problems of significant two-state density changes and device failure after multiples times of cyclic erasing and writing found in an existing superlattice phase-change memory device.

To achieve the above objective, according to the first aspect, the disclosure provides a superlattice phase-change thin film with a low density change, and the superlattice phase-change thin film includes a first phase-change layer having a positive density change during crystallization and a second phase-change layer having a negative density change during crystallization.

The first and second phase-change layers are alternately stacked to form a periodic structure, and the second phase-change layer adopts a chromium germanium tellurium ternary alloy material.

Preferably, a ratio of a thickness of the second phase-change layer to a thickness of the first phase-change layer is an absolute value of a reciprocal of a density change ratio of the two during phase changing. Herein, the superlattice phase-change thin film formed by the alternately-stacked the first and second phase-change layers has an overall density change of zero during phase changing.

Preferably, in the superlattice phase-change thin film, the first phase-change layer adopts any one of a Sb elementary substance, a Ge—Te binary compound, a Ge—Sb binary compound, a Sb—Te binary compound, a Bi—Te binary compound, an In—Se binary compound, a Ge—Sb—Te ternary compound, a Ge—Bi—Te ternary compound, a Ge—Sb—Bi—Te quaternary compound, or a compound formed by doping them with elements.

The doped element is at least one of C, Cu, N, O, Si, Sc, Ti, Ag, and In.

Preferably, in the superlattice phase-change thin film, the second phase-change layer is CrGeTe$_3$.

The first phase-change layer is any one of GeTe, Sb$_2$Te$_3$, Bi$_2$Te$_3$, Ge$_2$Sb$_2$Te$_5$, and Ge$_1$Sb$_2$Te$_4$.

Preferably, in the superlattice phase-change thin film, the thickness of the first phase-change layer is 1 nm to 10 nm, and the number of cycles of the superlattice phase-change structure formed by the first and second phase-change layers is 5 to 100.

According to the second aspect, the disclosure further provides a phase-change memory including the abovementioned superlattice phase-change thin film, the phase-change memory includes an upper electrode and a lower electrode, and the superlattice phase-change thin film is disposed between the upper electrode and the lower electrode.

Preferably, the phase-change memory further includes a substrate layer, an insulating layer, and a heating layer.

The lower electrode is disposed between the substrate layer and the insulating layer, the insulating layer is internally provided with a through hole for filling the heating layer, and the heating layer is configured to connect the lower electrode and a phase-change material layer in the superlattice phase-change thin film.

Preferably, in the phase-change memory, a material of the upper electrode and the lower electrode is selected from any one of Al, W, Ag, Cu, Au, Pt, Ti$_3$W$_7$.

A material of the insulating layer is selected from any one of SiO2, SiC, (ZnS)$_x$(SiO2)$_{100-x}$; where x is an integer greater than 0 and less than 100.

A material of the heating layer is selected from any one of W, TiN, and Ti$_3$W$_7$.

According to the third aspect, the disclosure further provides a preparation method for a phase-change memory, and the method includes the following steps.

A lower electrode and an insulating layer are sequentially deposited on a surface of a substrate layer.

A through hole penetrating the insulating layer and contacting a surface of the lower electrode is internally etched in the insulating layer, and a heating layer is internally deposited in the through hole.

A first phase-change layer and a second phase-change layer are alternately deposited on surfaces of the heating layer and the insulating layer to form a superlattice phase-change thin film with a low density change. The first phase-change layer has a positive density change during crystallization, and the second phase-change layer adopts a chromium germanium tellurium ternary alloy material with a negative density change during crystallization.

An upper electrode is deposited on a surface of the superlattice phase-change thin film.

Preferably, in the preparation method, a ratio of a thickness of the second phase-change layer to a thickness of the first phase-change layer is an absolute value of a reciprocal of a density change ratio of the two during phase changing.

Preferably, in the preparation method, the first phase-change layer adopts any one of a Sb elementary substance, a Ge—Te binary compound, a Ge—Sb binary compound, a Sb—Te binary compound, a Bi—Te binary compound, an In-Se binary compound, a Ge—Sb—Te ternary compound, a Ge—Bi—Te ternary compound, a Ge—Sb—Bi—Te quaternary compound, or a compound formed by doping them with elements.

The doped element is at least one of C, Cu, N, O, Si, Sc, Ti, Ag, and In.

Preferably, in the preparation method, a material of the second phase-change memory is CrGeTe$_3$.

The first phase-change layer is any one of GeTe, Sb$_2$Te$_3$, Bi$_2$Te$_3$, Ge$_2$Sb$_2$Te$_5$, and Ge$_1$Sb$_2$Te$_4$.

Preferably, in the preparation method, the thickness of the first phase-change layer is 1 nm to 10 nm, and the number of cycles of the superlattice phase-change structure formed by the first and second phase-change layers is 5 to 100.

Preferably, in the preparation method, a material of the upper electrode and the lower electrode is selected from any one of Al, W, Ag, Cu, Au, Pt, Ti$_3$W$_7$.

A material of the insulating layer is selected from any one of SiO$_2$, SiC, (ZnS)$_x$(SiO$_2$)$_{100-x}$ (x is an integer greater than 0 and less than 100).

A material of the heating layer is selected from any one of W, TiN, and Ti$_3$W$_7$.

In general, the above technical solutions provided by the disclosure have the following beneficial effects compared with the related art.

(1) The disclosure provides a superlattice phase-change thin film with a low density change, a phase-change memory, and a preparation method therefore. A phase-change material with an abnormal negative density change is selected for one of the phase-change components in the superlattice phase-change thin film. By appropriately adjusting the thickness ratio of the phase-change material with an abnormal negative density change and the phase-change material with a conventional positive density change, the low density or even zero density change of the superlattice phase-change memory material during phase changing may be achieved. The problem of "voids" in the structure of the phase-change memory device caused by the density change during the repeated erasing and writing process is thereby solved.

(2) In the two-dimensional material improved superlattice phase-change thin film, phase-change memory, and preparation method therefore provided by the disclosure, when the superlattice phase-change thin film with a low density or even zero density change is applied in the phase-change memory, the stability of cyclic erasing and writing of the phase-change memory device may be significantly increased, and the service life of the device is prolonged. A superlattice phase-change memory with high cyclic erasing and writing times is suitable for application scenarios that require frequent data exchange, so it is expected to replace DRAM in computers and thereby profoundly change the current architecture of computers.

(3) In the two-dimensional material improved superlattice phase-change thin film, phase-change memory, and preparation method therefore provided by the disclosure, the preparation method is compatible with the existing CMOS processing process, and the process of the preparation method is mature and simple and may be easily implemented.

Figure 1:
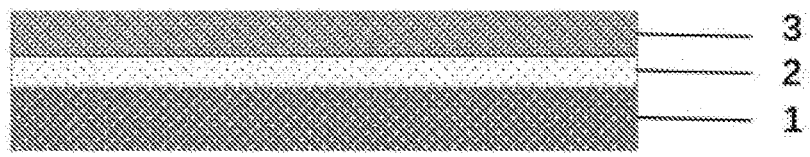
FIG. 1 is a first schematic diagram of a stage of a preparation process of a phase-change memory having a superlattice phase-change thin film with a low density change provided by an embodiment of the disclosure.

In the accompanying drawings, the same reference numerals are used to represent identical or similar technical features, and the following are specifically included: 1—substrate, 2—substrate thermal growth layer, 3—lower electrode layer, 4—insulating layer, 5—heating layer, 6—upper electrode layer, 7—first phase-change layer, and 8—second phase-change layer.

DESCRIPTION OF THE EMBODIMENTS

In order to make the objectives, technical solutions, and advantages of the disclosure clearer and more comprehensible, the disclosure is further described in detail with reference to the drawings and embodiments. It should be understood that the specific embodiments described herein serve to explain the disclosure merely and are not used to limit the disclosure. In addition, the technical features involved in the various embodiments of the disclosure described below can be combined with each other as long as the technical features do not conflict with each other.

One of the main reasons for the failure of a phase-change memory in a cyclic erasing and writing process is the formation of "voids" in this process, isolating the effective phase-change area of the phase-change material from the surrounding phase-change material, so that the current path in the device is disconnected. The reason for the formation of these "voids" is that the densities of a phase-change memory material in the crystalline state and in the amorphous state are different, that is, the volumes of the phase-change memory materials of the same mass in the crystalline state and in the amorphous state are different. When a phase-change memory material repeatedly changes between the crystalline state and the amorphous state, its volume continuously expands and contracts, and spatial "voids" are formed in the phase-change memory device in this process. If a superlattice phase-change memory material and device with a low density or even zero density change is provided in the cyclic erasing and writing process, the stability of cyclic erasing and writing of the phase-change memory may be significantly improved, and the service life of the device may be prolonged.

The embodiments of the disclosure provide a superlattice phase-change thin film with a low density change, and the superlattice phase-change thin film includes a first phase-change layer and a second phase-change layer. During crystallization, the first phase-change layer has a conventional positive density change, and the second phase-change layer has an abnormal negative density change. The opposite density change characteristics of the first phase-change layer and the second phase-change layer make their volume changes complementary during crystallization, so that the density and volume changes of the superlattice phase-change thin film during the crystalline state change process are effectively reduced, low density changes are achieved, and "voids" are prevented from being generated.

The first and second phase-change layers are alternately stacked to form a periodic structure, and the second phase-change layer adopts a chromium germanium tellurium ternary alloy material. The amorphous state of the chromium-germanium-tellurium ternary alloy has a higher atomic stack density than the crystalline state due to the presence of the chromium-chromium bond, so a negative density change occurs when the amorphous state is converted to the crystalline state. Conventional phase-change materials, such as GeTe, $Sb_2Te_3$, etc., all have a higher stack density in the crystalline state, and therefore, a positive density change occurs when the amorphous state is converted to the crystalline state.

Further, a ratio of a thickness of the second phase-change layer to a thickness of the first phase-change layer is an absolute value of a reciprocal of a density change ratio of the two phase-change materials during phase changing. Herein, the superlattice phase-change thin film formed by the alternately-stacked the first and second phase-change layers has an overall density change of zero during phase changing, that is, the superlattice phase-change thin film has zero density change. In actual application scenarios, it is necessary to take into account the density change of the superlattice phase-change material and the balance of electrical characteristics. The ratio of the thickness of the second phase-change layer to the thickness of the first phase-change layer may be adjusted appropriately to obtain a superlattice phase-change thin film material with a low density change but more favorable electrical characteristics.

A superlattice structure of a superlattice phase-change thin film provided by this embodiment is $[A_mB_n]_z$, where A and B respectively represent a phase-change material of the first phase-change layer and a phase-change material of the second phase-change layer with a negative density change, m and n respectively represent the thicknesses of the first and second phase-change layers, the default unit is nanometers, and z is the number of cycles of the superlattice. In this embodiment, $1<m<10$, the ratio of n to m is equal to the absolute value of the reciprocal of the ratio of density change ratios of the phase-change materials corresponding to the second phase-change layer and the first phase-change layer, $5<z<100$, m and n are real numbers, and z is an integer.

$CrGeTe_3$ is preferably used as the second phase-change layer in this embodiment, and $CrGeTe_3$ has a negative density change ratio during crystallization, and its density change ratio is −0.4%.

The phase-change material used in the first phase-change layer is an intrinsic elementary substance material or a compound material, and it may also be an element-doped elementary substance material or a compound material. Herein, the elementary substance material may be selected from a Sb elementary substance, and the compound material is selected from any one of a Ge and Te binary alloy, a Ge and Sb binary alloy, a Sb and Te binary alloy, a Bi and Te binary alloy, an In and Se binary alloy, a Ge, Sb, and Te ternary alloy, a Ge, Bi, and Te ternary alloy, and a Ge, Sb, Bi, and Te quaternary alloy, and preferably selected from any one of GeTe, $Sb_2Te_3$, $Bi_2Te_3$, $Ge_2Sb_2Te_5$, and $Ge_1Sb_2Te_4$. The doped element may be at least one of C, Cu, N, O, Si, Sc, Ti, Ag, and In, and a proper amount of doping may improve the stability of cyclic erasing and writing and the SET speed of the superlattice phase-change unit and reduce the power consumption of RESET.

A preparation method of the first and second phase-change layers may adopt any one of the magnetron sputtering method, atomic layer deposition method, molecular beam epitaxy method, pulsed laser deposition method, physical vapor deposition method, chemical vapor deposition method, thermal evaporation method, or electrochemical growth method.

This embodiment further provides a phase-change memory. The phase-change memory includes the above-mentioned superlattice phase-change thin film and further includes an upper electrode and a lower electrode. The superlattice phase-change thin film is disposed between the upper electrode and the lower electrode and includes the first and second phase-change layers that are alternately stacked, and the second phase-change layer has an abnormal negative density change ratio during crystallization. In the process of crystallization and amorphization of the negative density change layer, its volume change is opposite to that of the ordinary phase-change material layer. Therefore, the superlattice phase-change thin film formed by stacking the two has a low density or even zero density change during the phase-change process. Regarding the phase-change memory formed by using the superlattice phase-change memory material with a low density change, since the "voids" caused by the volume change of the phase-change material during the phase-change process are suppressed, improved cyclic erasing and writing stability is thereby provided.

Further, the phase-change memory provided in this embodiment is a T-structure phase-change memory cell and includes a substrate layer, an insulating layer, and a heating layer. The lower electrode is disposed between the substrate layer and the insulating layer, the insulating layer is internally provided with a through hole for filling the heating layer, and the heating layer is configured to connect the lower electrode and the superlattice phase-change thin film. Herein, a material of the upper electrode and the lower electrode is selected from any one of Al, W, Ag, Cu, Au, Pt, and Ti3W7, a material of the insulating layer is selected from any one of $SiO_2$, SiC, and $(ZnS)_x(SiO_2)_{100-x}$ (x is an integer greater than 0 and less than 100), and a material of the heating layer is selected from any one of W, TiN, and $Ti_3W_7$. The substrate layer includes a single crystal silicon substrate and a $SiO_2$ thermal growth layer formed on the single crystal silicon substrate, and the thermal growth layer is mainly configured to isolate the single crystal silicon substrate and the lower electrode.

A preparation method of the phase-change memory is provided in this embodiment, and the method includes the following steps.

S1: The lower electrode and the insulating layer are sequentially deposited on a surface of the substrate layer.

S2: A through hole penetrating the insulating layer and contacting a surface of the lower electrode is internally etched in the insulating layer, and the heating layer is internally deposited in the through hole.

S3: The first phase-change layer and the second phase-change layer are alternately deposited on surfaces of the heating layer and the insulating layer to form the superlattice phase-change thin film. During crystallization, the first phase-change layer has a conventional positive density change, and the second phase-change layer has an abnormal negative density change. The second phase-change material layer is $CrGeTe_3$ in this embodiment.

S4: The upper electrode is deposited on a surface of the superlattice phase-change thin film.

The preparation method of the phase-change memory provided by this embodiment is compatible with the existing CMOS process, and the process of the preparation method is mature and simple and may be easily implemented. The superlattice phase-change thin film in the phase-change memory exhibits advantages of a small density change before and after phase changing and good cyclic erasing and writing stability.

The structure and manufacturing process of the phase-change memory provided by the disclosure are described in detail below in combination with specific embodiments and accompanying drawings.

FIGS. 1-7 are schematic diagrams of stages of a preparation process of a phase-change memory having the superlattice phase-change thin film with a zero density change characteristic provided by the embodiments of the disclosure. The superlattice thin film phase-change memory cell prepared in this embodiment has a "mushroom type" structure commonly used in phase-change memories. In this embodiment, a phase-change material A adopted in the first phase-change layer is $Ge_2Sb_2Te_5$, the density change ratio during crystallization is 7%, and the thickness is 1 nm. A phase-change material B adopted in the second phase-change layer is $CrGeTe_3$, the density change ratio during crystallization is −0.4%, and the ratio of the thickness thereof to the thickness of the A layer is the absolute value of the reciprocal of the ratio of the density change ratios of the two (7%/0.4%=17.5), so the thickness of the second phase-change layer is 17.5 nm. The number of cycles of the superlattice is 12. The specific preparation process is provided as follows.

(1) With reference to FIG. 1, a 500 μm thick and (100)—oriented silicon wafer is selected first as a substrate 1, and a 1 μm thick $SiO_2$ thin film layer, i.e., a substrate thermal growth layer 2, is formed on a surface of the silicon substrate 1 by a thermal growth method. The silicon wafer is cut into a size of 1 cm×1 cm and placed in a beaker and is ultrasonically cleaned for 10 minutes after an appropriate amount of acetone is injected. After cleaning, absolute ethanol is used for cleaning for 10 minutes, deionized water is used for cleaning for ten minutes, and dried with a nitrogen gun. Impurities on the surface of the substrate may be removed through cleaning, which is conducive to improving the stability of the device. Next, an Al lower electrode layer 3 is formed on the thermal growth layer 2 by a magnetron sputtering method.

Figure 2:
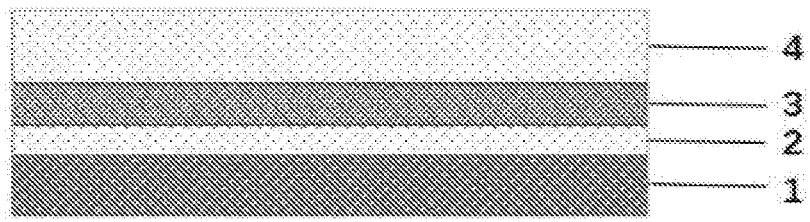
FIG. 2 is a second schematic diagram of a stage of the preparation process of the phase-change memory having the superlattice phase-change thin film with a low density change provided by an embodiment of the disclosure.

(2) With reference to FIG. 2, a piece of the substrate on which the Al electrode layer 3 is formed is used, and a layer of SiO2 is grown as an insulating layer 4 on the Al lower electrode layer 3 by a chemical vapor deposition method.

Figure 3:
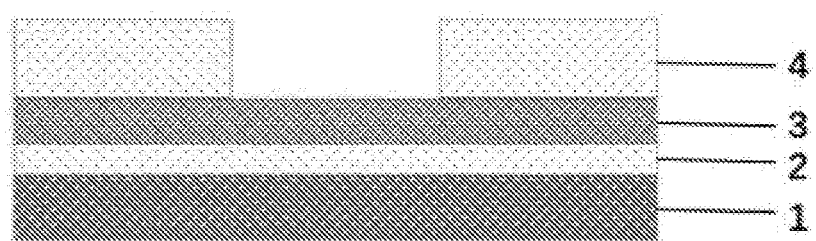
FIG. 3 is a third schematic diagram of a stage of the preparation process of the phase-change memory having the superlattice phase-change thin film with a low density change provided by an embodiment of the disclosure.
Figure 4:
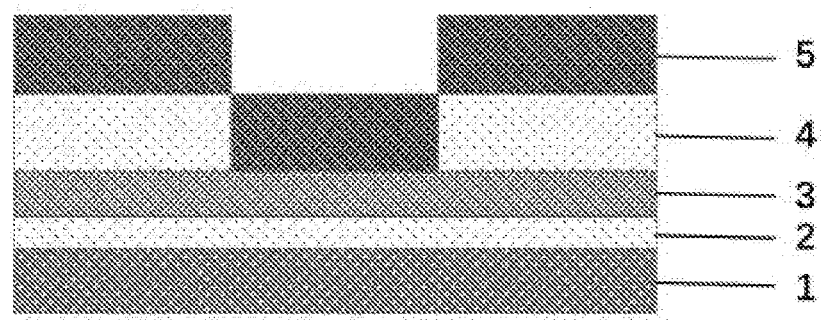
FIG. 4 is a fourth schematic diagram of a stage of the preparation process of the phase-change memory having the superlattice phase-change thin film with a low density change provided by an embodiment of the disclosure.
Figure 5:
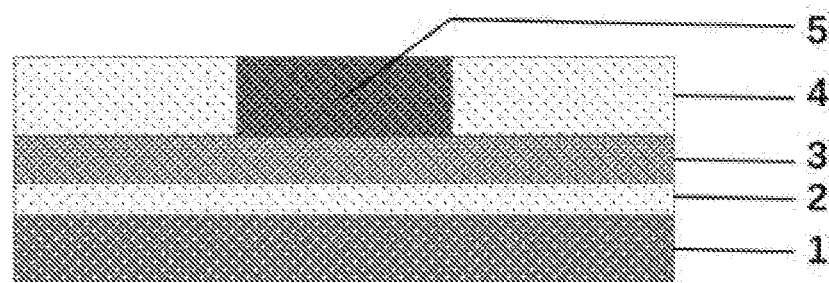
FIG. 5 is a fifth schematic diagram of a stage of the preparation process of the phase-change memory having the superlattice phase-change thin film with a low density change provided by an embodiment of the disclosure.
Figure 6:
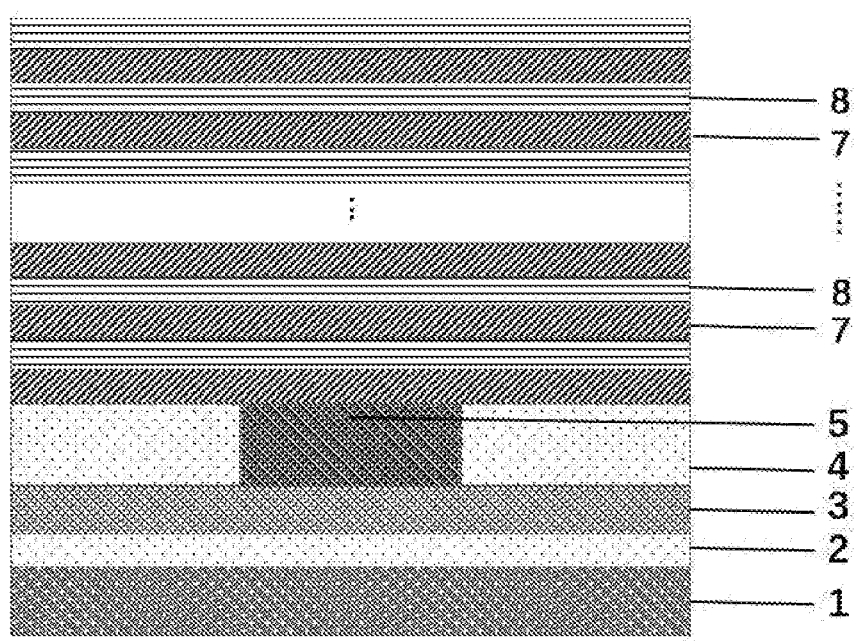
FIG. 6 is a sixth schematic diagram of a stage of the preparation process of the phase-change memory having the superlattice phase-change thin film with a low density change provided by an embodiment of the disclosure.

(3) With reference to FIG. 3, a through hole is etched on the $SiO_2$ insulating layer 4 by a photolithography and etching process. The through hole penetrates the insulating layer 4 and contacts the lower electrode layer 3, and a diameter of the through hole in this embodiment is 130 nm.

(4) With reference to 4, TiN is deposited inside the through hole obtained in step (3) to act as a heating layer 5 through a magnetron sputtering method, and during the deposition process, an excess TiN heating layer 5 may inevitably be formed on a surface of the $SiO_2$ insulating layer 4.

(5) With reference to 5, the excess TiN heating layer 5 on the surface of the $SiO_2$ insulating layer 4 is removed through chemical mechanical polishing (CMP), and the TiN heating layer 5 in the through hole of the $SiO_2$ insulating layer 4 is kept.

(6) With reference to 6, a first phase-change layer 7 and a second phase-change layer 8 are alternately deposited through a chemical vapor deposition method. The material of the first phase-change layer 7 is $Ge_2Sb_2Te_5$, and the material of the second phase-change layer 8 is $CrGeTe_3$. In the chemical vapor deposition method, the thickness of the first phase-change layer 7 and the thickness of the second phase-change layer 8 may be controlled by controlling the time of supplying a gas source. The specific process of the deposition is as follows: the gas source $Ge_2Sb_2Te_5$ required for depositing the first phase-change layer 7 is supplied first, and supplying of the corresponding gas source is stopped after the gas supply time reaches a predetermined value. The gas in the chamber is purged with nitrogen, and the gas source $CrGeTe_3$ required by the second phase-change layer 8 is supplied instead. After the gas supply time reaches the predetermined value, supplying of the corresponding gas source is stopped, and the nitrogen gas is used to purge the remaining gas in the chamber. The process of depositing the first phase-change layer 7 and the second phase-change layer 8 is repeated until the number of cycles of the alternate growth of the first phase-change layer 7 and the second phase-change layer 8 reaches the predetermined value 12.

Figure 7:
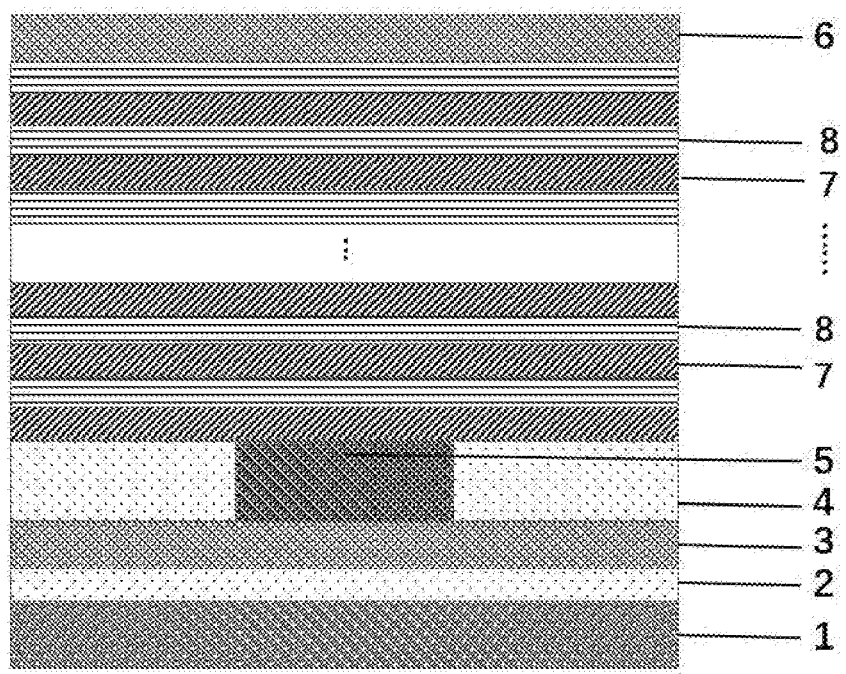
FIG. 7 is a seventh schematic diagram of a stage of the preparation process of the phase-change memory having the superlattice phase-change thin film with a low density change provided by an embodiment of the disclosure.

(7) With reference to FIG. 7, on the surface of the superlattice phase-change thin film formed in step (6), an Al upper electrode layer 6 is formed through magnetron sputtering deposition.

By applying an electrical signal between the upper electrode layer 6 and the lower electrode layer 3, the SET and RESET operations of the superlattice phase-change memory cell with a zero density change may be achieved.

A phase-change memory is further provided in this embodiment, and the phase-change memory includes a memory array formed by a plurality of the abovementioned superlattice phase-change thin films with a low density change and further includes a control circuit, a word line decoder, a bit line decoder, and other peripheral circuits. Herein, the word line decoder is electrically connected to a plurality of word lines arranged in a row direction of the memory array. The bit line decoder is electrically connected to a plurality of bit lines arranged in the column direction of the memory array. The control circuit may be implemented by a general-purpose processor or a logic circuit commonly used in the field. Other peripheral circuits include, but not limited to, power supply circuits, sensing circuits, and so on.

Compared to the conventional phase-change memory material, in the superlattice phase-change thin film with a low density change, the phase-change memory, and the preparation method therefor provided by the disclosure, a conventional phase-change material with a positive density change and a phase-change material with an abnormal negative density change are alternately grown to form the superlattice phase-change thin film. Compared to the ordinary phase-change memory material, the phase-change material with a negative density change has volume change with opposite signs during phase changing. Therefore, the superlattice phase-change material formed by alternately stacking a phase-change material with a negative density change and a conventional phase-change material with a positive density change has a smaller density change. In this way, the "voids" formed by the volume change of the phase-change memory device during repeated electrical operations is effectively prevented from being generated. In the disclosure, the stability of cyclic erasing and writing of the superlattice phase-change memory device with a low density change is expected to be significantly increased, and the service life of the device is prolonged.

A person having ordinary skill in the art should be able to easily understand that the above description is only preferred embodiments of the disclosure and is not intended to limit the disclosure. Any modifications, equivalent replacements, and modifications made without departing from the spirit and principles of the disclosure should fall within the protection scope of the disclosure.

What is claimed is:

1. A superlattice phase-change thin film, comprising a plurality of units, and the plurality of units at least comprises one unit and another unit stacked on the one unit,
   wherein the one unit and the another unit respectively comprises:
      a first phase-change layer having a positive density change during crystallization; and
      a second phase-change layer having a negative density change during crystallization, wherein the second phase-change layer is disposed on the first phase-change layer, and the second phase-change layer adopts a chromium germanium tellurium ternary alloy material,
   wherein two sides of the second phase-change layer of the one unit respectively contacts with the first phase-change layer of the one unit and the first phase-change layer of the another unit,
   wherein a first ratio of a thickness of the second phase-change layer to a thickness of the first phase-change layer is A, a second ratio of a density change ratio of the second phase-change layer to a density change ratio of the first phase-change layer during phase changing is B, and the first ratio A is an absolute value of a reciprocal of the second ratio B.

2. The superlattice phase-change thin film according to claim 1, wherein the first phase-change layer adopts any one of a Sb elementary substance, a Ge—Te binary compound, a Ge—Sb binary compound, a Sb—Te binary compound, a Bi—Te binary compound, an In-Se binary compound, a Ge—Sb—Te ternary compound, a Ge—Bi—Te ternary compound, a Ge—Sb—Bi—Te quaternary compound, or a compound formed by doping them with element, and
   the doped element is at least one of C, Cu, N, O, Si, Sc, Ti, Ag and In.

3. The superlattice phase-change thin film according to claim 2, wherein the second phase-change layer adopts $CrGeTe_3$, and
   the first phase-change layer adopts any one of GeTe, $Sb_2Te_3$, $Bi_2Te_3$, $Ge_2Sb_2Te_5$ and $Ge_1Sb_2Te_4$.

4. A phase-change memory, comprising: the superlattice phase-change thin film according to claim 3, an upper electrode and a lower electrode, and the superlattice phase-change thin film is disposed between the upper electrode and the lower electrode.

5. A phase-change memory, comprising: the superlattice phase-change thin film according to claim 2, an upper electrode and a lower electrode, and the superlattice phase-change thin film is disposed between the upper electrode and the lower electrode.

6. A phase-change memory, comprising: the superlattice phase-change thin film according to claim 1, an upper electrode and a lower electrode, and the superlattice phase-change thin film is disposed between the upper electrode and the lower electrode.

7. The phase-change memory according to claim 6, further comprising: a substrate layer, an insulating layer and a heating layer,
wherein the lower electrode is disposed between the substrate layer and the insulating layer, the insulating layer is internally provided with a through hole for filling the heating layer, and the heating layer is configured to connect the lower electrode and a phase-change material layer with the superlattice phase-change thin film.

8. The phase-change memory according to claim 7, wherein a material of the upper electrode and the lower electrode is selected from any one of Al, W, Ag, Cu, Au, Pt, and $Ti_3W_7$,
a material of the insulating layer is selected from any one of $SiO_2$, SiC and $(ZnS)_x (SiO_2)_{100-x}$, wherein x is an integer greater than 0 and less than 100, and
a material of the heating layer is selected from any one of W, TiN and $Ti_3W_7$.

9. A preparation method of a phase-change memory, comprising the following steps:
sequentially depositing a lower electrode and an insulating layer on a surface of a substrate layer;
internally etching a through hole penetrating the insulating layer and contacting a surface of the lower electrode in the insulating layer and internally depositing a heating layer in the through hole; and
forming a superlattice phase-change thin film, wherein the superlattice phase-change thin film comprises a plurality of units, and the plurality of units at least comprises one unit and another unit stacked on the one unit,
wherein the one unit and the another unit respectively comprises:
a first phase-change layer has a positive density change during crystallization, and
a second phase-change layer disposed on the first phase-change layer, wherein the second phase-change layer adopts a chromium germanium tellurium ternary alloy material with a negative density change during crystallization; and
depositing an upper electrode on a surface of the superlattice phase-change thin film,
wherein two sides of the second phase-change layer of the one unit respectively contacts with the first phase-change layer of the one unit and the first phase-change layer of the another unit,
wherein a first ratio of a thickness of the second phase-change layer to a thickness of the first phase-change layer is A, a second ratio of a density change ratio of the second phase-change layer to a density change ratio of the first phase-change layer during phase changing is B, and the first ratio A is an absolute value of a reciprocal of the second ratio B.

10. The preparation method according to claim 9, wherein the second phase-change layer adopts $CrGeTe_3$, and
the first phase-change layer adopts any one of GeTe, $Sb_2Te_3$, $Bi_2Te_3$, $Ge_2Sb_2Te_5$ and $Ge_1Sb_2Te_4$.

* * * * *